United States Patent [19]
Oyama

[11] Patent Number: 5,691,552
[45] Date of Patent: Nov. 25, 1997

[54] NONVOLATILE SEMICONDUCTOR MEMORY FORMED WITH SILICON-ON-INSULATOR STRUCTURE

[75] Inventor: Kenichi Oyama, Tokyo, Japan

[73] Assignee: NEC Corporation, Tokyo, Japan

[21] Appl. No.: 547,629

[22] Filed: Oct. 24, 1995

[30] Foreign Application Priority Data

Oct. 26, 1994 [JP] Japan ................................. 6-260844

[51] Int. Cl.$^6$ ...................... H01L 29/788; G11C 11/34
[52] U.S. Cl. .................... 257/316; 257/319; 257/320; 257/321; 257/322; 257/324; 365/185.01; 365/185.02; 365/185.17; 365/104; 365/149
[58] Field of Search ....................... 257/316, 321, 257/324, 319, 320, 322; 365/185.01, 185.02, 185.17, 104, 149

[56] References Cited

U.S. PATENT DOCUMENTS 5,493,140 2/1996 Iguchi ........................ 257/316

FOREIGN PATENT DOCUMENTS 1-235278 9/1989 Japan.

*Primary Examiner*—Edward Wojciechowicz
*Attorney, Agent, or Firm*—Young & Thompson

[57] ABSTRACT

The invention provides an electrically erasable and programmable nonvolatile memory having a plurality of memory cells (M1 to M8) connected in series to each other to form a NAND type flash memory array. Each of the memory cells is constructed of a floating gate, a control gate, a source region, a drain region and a channel region. Each of the memory cells is formed in a semiconductor film (3a) formed on an insulating substrate. Further, a plurality of control transistors (T1 to T8) for transmitting a voltage applied to one end of NAND array to a selected memory cell in the selective writing mode are formed of a side wall of the semiconductor film. Each of the control transistors is connected in parallel to an associated one of the memory cells.

15 Claims, 4 Drawing Sheets

NONVOLATILE SEMICONDUCTOR MEMORY FORMED WITH SILICON-ON-INSULATOR STRUCTURE

BACKGROUND OF THE INVENTION

1. Field of the Invention

This invention relates to an electrically programmable and writable nonvolatile semiconductor memory device, more particularly, to a nonvolatile semiconductor memory device called an NAND type flash memory wherein a plurality of memory cells are connected in series to each other. Each memory cell has a floating gate electrode and a control gate electrode which are stacked. These NAND cells are arranged in a matrix to constitute a memory cell array.

2. Description of the Prior Art

In the field of nonvolatile memory, an NAND type flash memory has recently been developed. The NAND cells are composed of a plurality of memory cells connected in series to each other, thereby obviating the need to make a plurality of contacts to connect memory cells to each other. Therefore, it is easy to decrease an area of the cell size (see FIG. 1).

In this NAND type flash memory, all of the data stored in memory cells are simultaneously erased (hereinafter referred as flash erase) by injecting electrons into the floating gates to increase the threshold voltage of all the memory cells. Thereafter, a selective data writing operation for each memory cell is carried out one by one by discharging the electrons stored in a floating gate of a selected memory cell to decrease the threshold voltage thereof below zero volts.

The operations of the flash erase and selective writing modes will be described precisely with reference to FIG. 1.

In the flash erase mode, the injection of the electrons into all the floating gates is carried out by supplying a low voltage (for example, 0 volts) to source and drain terminals and a high voltage (for example, 20 volts) to the control gates of all the memory cells (M1 to M8), while the select transistors S1 and S2 are on. Therefore, a tunnel current flows from each drain to the corresponding floating gate through an oxide film between a channel region and the floating gate so that all the threshold voltages of the memory cells are enhanced simultaneously. Thus, all the memory cells are set to the enhancement mode.

In the selective writing mode, data are written in order from the memory cell disposed on the source terminal side to the one on the drain terminal side. Before data writing, the drain terminal is set at the high voltage, while the select transistor S1 is off and S2 is on. Then, the low voltage is supplied to the control gate of the selected memory cell, while all the control gates of non-selected cells disposed on the drain terminal side of the selected cell are set at the high voltage so that they transmit a voltage approximately equal to the voltage at the drain terminal to the drain region of the selected cell. As a result, it is possible to discharge the stored electrons from the selected floating gate to the corresponding drain region. Thus, the selected memory cell is set to the depletion mode.

However, there arises some problems in the selective writing mode. Namely, the voltage value transmitted by every non-selected cells mentioned above is only the value obtained by subtracting the threshold voltage thereof from the voltage applied to the control gate. Moreover, there arises some variations among the threshold voltages of the memory cells arranged in the memory cell array when the flash erase operations are performed. Therefore, the threshold voltages of some memory cells may become too high so that a sufficient voltage may not be transmitted by some of the memory cells. Further, the flash erasing must be carried out before the selective data writing. As a result, the threshold voltage of the cell which has not being written before the flash erasing is further enhanced by the flash erasing so that it may be impossible for such a memory cell to transmit a sufficient voltage in selective writing mode.

To solve the above problems, Japanese published Patent Application Heisei 1-235278 has been proposed an NAND cell shown in FIGS. 2A to 2C. FIG. 2A is a plan view of the NAND cell, FIG. 2B is a cross sectional view taken along the line B–B' of FIG. 2A, and FIG. 2C is an equivalent circuit diagram of the NAND cell. FIG. 2D is a graph showing the relationship between a control voltage and a channel current of the memory cell. The NAND cell is comprised of memory cell transistors (M1 to M8), control transistors (T1 to T8) and select transistors (S1 to S2). In FIG. 2B, is shown a semiconductor substrate 10, a field oxide film (LOCOS) 11, a gate oxide film 12, a floating gate 13 and a control gate, 14. As shown in the sectional view of FIG. 2B, the memory cell disclosed in Published Patent Application Heisei 1-235278 has such a structure that the floating gate 13 covers a part of the channel region in a channel width direction. As a result, the NAND cell may be illustrated as the equivalent circuit diagram in FIG. 2C. Each of the control MOS transistors T1 to T8 using a control gate 14 as a gate electrode is connected in parallel to corresponding one of the memory cells M1 to M8.

After flash erasing, the threshold voltage of some memory cells may be enhanced higher than a designed threshold voltage. A Id-Vcg characteristic of such a memory cell is illustrated as curve B shown in FIG. 2D. However, the threshold voltage of the control transistor does not depend on the amount of electron charge stored in the floating gate of the associated memory cell and depends only on the impurity concentration in the substrate. Therefore, if the threshold voltage of each control transistor is designed to be at least lower than a predetermined nominal threshold voltage for the erased memory cell, such as by setting the Id-Vcg characteristic of the control transistor to curve A shown in FIG. 2D, it is possible to enable the channel current of the composite transistors comprised of Mi and Ti to be large. Thus, a sufficient voltage is transmitted from the drain to the source by each of he and the selected memory cell is set to depletion mode as shown a curve C in FIG. 2D.

However, the electrically characteristics of the memory cells M1 to M8 and the control transistors T1 to T8 depend on channel width fluctuations caused during the lithography process which sets the position of the floating gate 13 after element isolation. Therefore, it is not easy to stabilize the Id-Vgs characteristics of both the control transistors and the memory transistors.

Further, the element regions are isolated by an element isolation oxide film formed with a LOCOS technique. A parasitic transistor is formed by the control gate 14 of the memory cells and the isolation oxide film. Therefore, in the actual design steps of the NAND cell, it is necessary to consider the element isolation characteristics of the parasitic transistor. Specifically, achieve excellent element isolation characteristics a sufficient distance must be taken between each memory cell of the NAND cell. Hence, the micronization of the cell region is difficult.

SUMMARY OF THE INVENTION

The object of the present invention is to provide a nonvolatile semiconductor memory device without fluctuation of the channel width of a control transistor connected in parallel to a memory cell, thereby to remove the variation of an Id-Vcg characteristic.

Another object of the present invention is to provide a nonvolatile semiconductor memory device which does not include an element isolation oxide film, thereby avoiding the parasitic transistor and facilitating micronization of the cell region.

The invention provides an electrically programmable and writable nonvolatile memory having a plurality of memory cells connected in series to each other to form an NAND type flash memory array. Each memory cell is constructed of a floating gate, a control gate, a source region, a drain region and a channel region. The memory cells are formed in an semiconductor film formed on a insulating substrate. Further, a plurality of control transistors for transmitting a voltage applied from one end of the NAND array to a selected memory cell in selective writing mode are formed from a side wall of the semiconductor film. Each of the control transistors is connected in parallel to an associated one of the memory cells.

BRIEF DESCRIPTION OF THE DRAWINGS

Further objects and advantages of the present invention will be apparent from the following description and the accompanying drawings wherein preferred embodiments of the present invention are clearly shown. In the drawing.

DETAILED DESCRIPTION OF THE PREFERRED EMBODIMENTS

Figure 1:
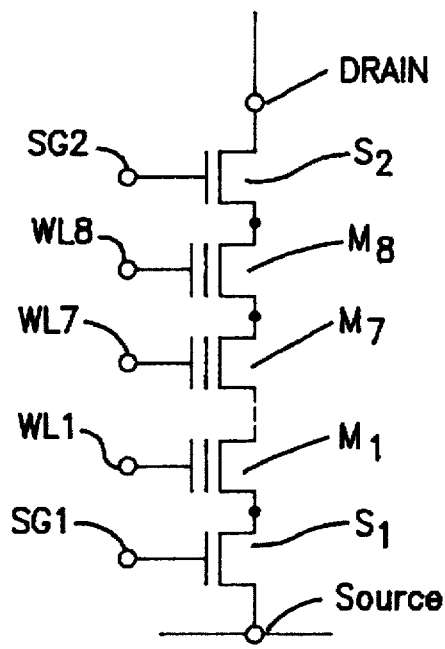
FIG. 1 is a equivalent circuit diagram of an conventional semiconductor memory device.
Figure 4A:
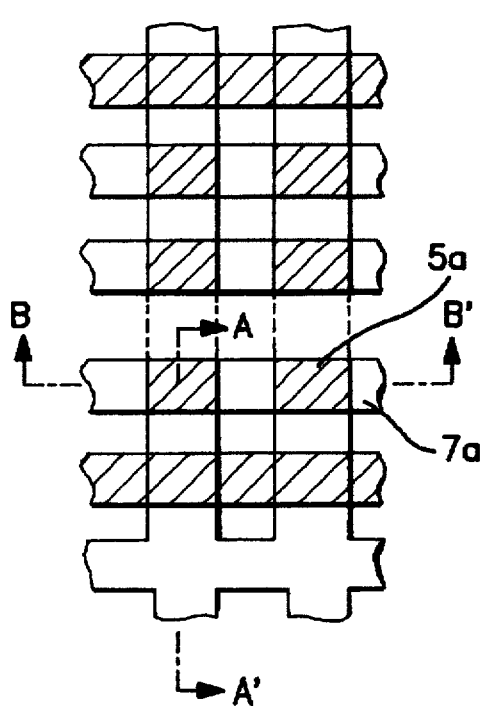
FIG. 4A is a plan view of the nonvolatile semiconductor memory device of the first embodiment of the present invention.
Figure 4B:
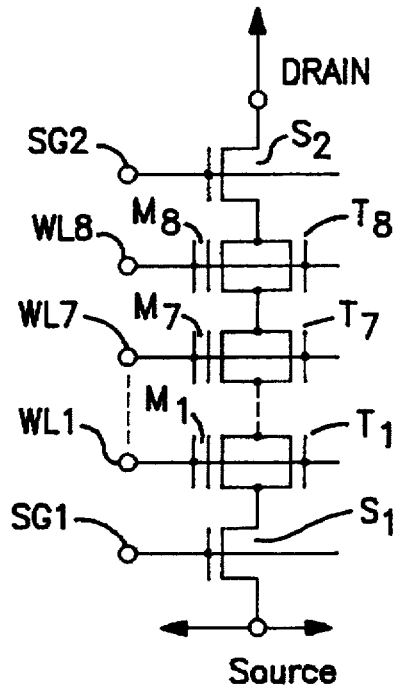
FIG. 4B is an equivalent circuit diagram of the nonvolatile semiconductor memory device of the first embodiment of the present invention.
Figure 3A:
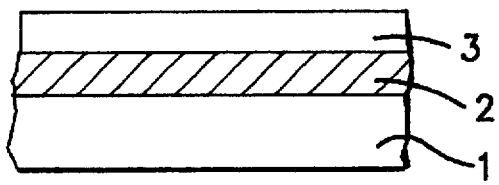
FIGS. 3A to 3F are sectional views showing manufacturing processes of a nonvolatile semiconductor memory device of a first embodiment of the present invention.
Figure 3B:
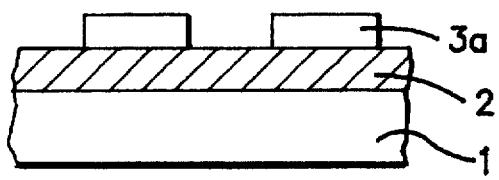
Figure 3C:
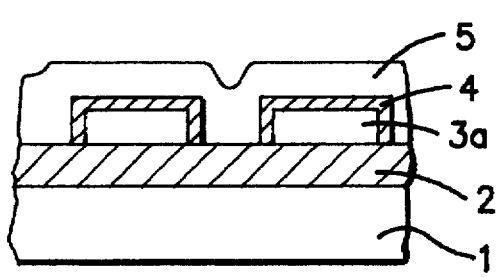
Figure 3D:
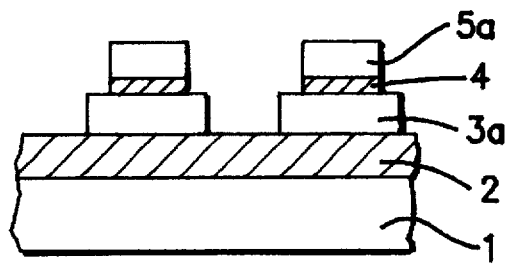
Figure 3E:
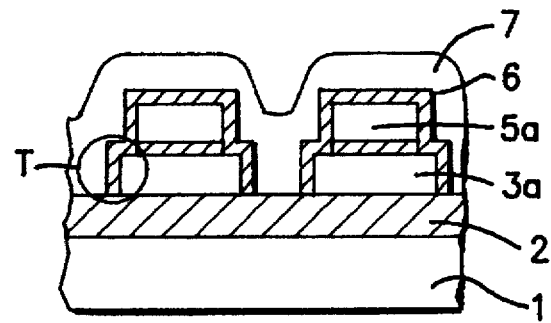
Figure 3F:
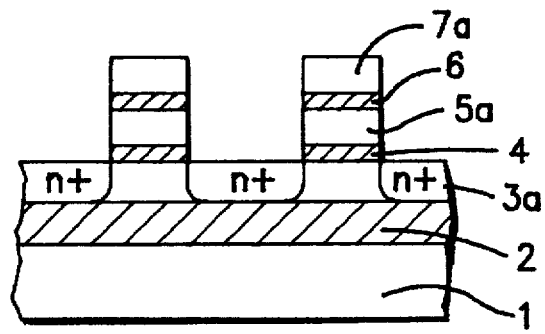

FIGS. 3A to 3F are sectional views showing manufacturing processes of a nonvolatile semiconductor memory device of a first embodiment of the present invention. FIG. 4A is a plan view of the nonvolatile semiconductor memory device obtained from the manufacturing processes of FIGS. 3A to 3F. FIG. 4B is an equivalent circuit diagram of the nonvolatile semiconductor memory device obtained from the manufacturing processes of FIGS. 3A to 3F. Note that FIGS. 3A to 3E are the sectional views taken along the line B–B' in FIG. 4A and FIG. 3F is the sectional view taken along the line A–A' in FIG. 4A.

As shown in FIG. 3A, in this embodiment, silicon on insulator substrate (hereinafter referred to as SOI substrate) is used. Here, the SOI substrate is composed of a silicon substrate 1, a silicon oxide film 2 and silicon thin film 3 formed thereon.

As shown in FIG. 3B, after forming the SOI substrate, the portions of the silicon thin film 3 other than element formation regions are removed by means of a photolithographic technique and an etching technique. As a result, stripe shaped portions (hereinafter referred to as silicon film 3a for simplicity of expression) separated from each other are formed. Thereafter, a first gate oxide film 4 as a first gate insulating film surrounding the silicon film 3a is formed by means of thermal oxide technique. Next, a polysilicon film 5 for a floating gate is formed on the resultant structure by means of CVD (Chemical Vapor Deposition) technique (see FIG. 3C).

Subsequently, as shown in FIG. 3D, the portions of the polysilicon film 5 not to be used as the floating gate are removed by means of photolithographic and etching techniques to form the floating gate 5a. Then, a second silicon oxide film 6 serving as a gate insulating film is formed on the surface of the exposed silicon thin films 3a and the floating gate 5a. Then, a polysilicon film 7 for the control gate is formed on the entire surface of the resultant structure (see FIG. 3E).

Thereafter, the polysilicon film 7 is processed to make the control gate 7a and other gate electrodes of other MOSFETs Then, impurities for forming the source and drain regions of the memory cells and other MOSFETs are vertically ion-implanted into silicon film 3a (see FIG. 3F). Finally, ordinary treatments such as wiring formation, processing, and the like are carried out to complete the formation of the nonvolatile semiconductor memory device of the present invention.

Figure 2A:
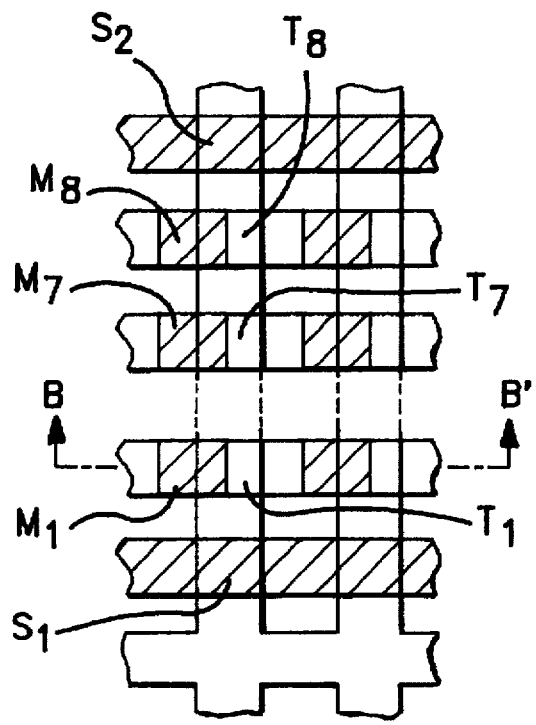
FIG. 2A is a plan view showing a conventional nonvolatile semiconductor memory device.
Figure 2C:
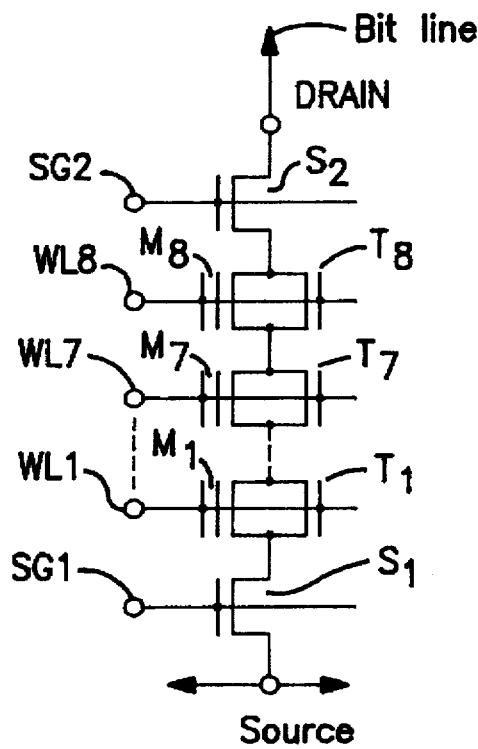
FIG. 2C is an equivalent circuit diagram of the conventional nonvolatile semiconductor memory device of FIG. 2A.
Figure 2B:
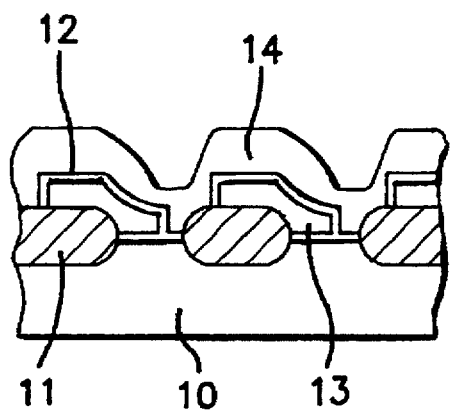
FIG. 2B is a sectional view taken along the line B–B' of FIG. 2A.
Figure 2D:
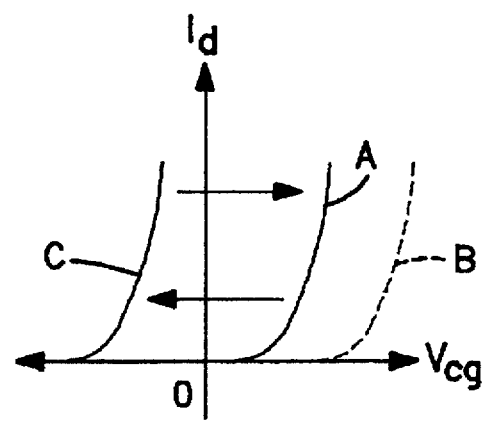
FIG. 2D is a graph showing a relationship between a control gate voltage and a channel current of the conventional nonvolatile semiconductor memory device of FIG. 2A to 2C.

As a result, NAND cells M1 to M8 are formed as shown in FIG. 4A and FIG. 4B. In the present invention, the control transistors T1 to T8 analogus to those shown in FIG. 2A and FIG. 2B are formed of the both side walls of the silicon film 3a and the control gate 7a. Such a control transistor is illustrated as T in FIG. 3E.

The threshold voltage of the control transistor is determined by the impurity concentration of the silicon film 3a and does not depend the amount of electron charge stored in the associated floating gate. Thus, these control transistors have the same function as that of the conventional structure shown in FIG. 2A and FIG. 2B. Therefore, the equivalent circuit obtained from this invention is the same as that of the conventional device.

However, in this invention, the channel width of the control transistor is determined only by a height of the side wall portion of the silicon film 3a and the channel width of the associated memory transistor is determined only by the width of the silicon film 3a. Therefore, the channel width fluctuations among the control gate and the memory transistors do not arise, because there is no need to use a photolithographic process for patterning the floating gate after the conventional element isolation process. Thus, the Id-Vcg characteristics of both control transistors and memory transistors are not modified by each other.

Further, the silicon thin film 3 (FIG. 3A), other than the portions forming the element regions is fully removed so that parasitic transistors are not produced in the element isolation region. Thus, in actual design steps of the nonvolatile memory device of the present invention, it is not necessary to consider the effect caused from the parasitic transistors formed in the element isolation regions. Therefore, it is possible to displace the NAND cells in close vicinity to each other so that greater micronization of the cell array region than in the conventional cell array can be realized.

Next, a second embodiment of the present invention will be described with reference to FIGS. 5A to 5E. FIGS. 5A to 5D show the sectional views taken along the line B–B' in FIG. 4A, and FIG. 5E shows the sectional view taken along the line A–A' in FIG. 4A.

Figure 5A:
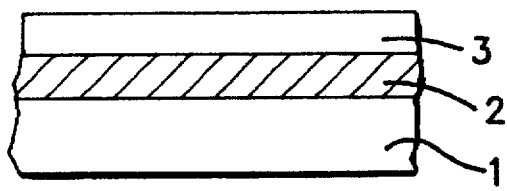
FIGS. 5A to 5E are sectional views showing manufacturing processes of a nonvolatile semiconductor memory device of a second embodiment of the present invention.
Figure 5D:
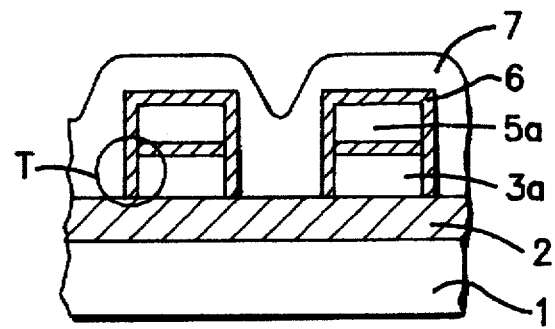
Figure 5B:
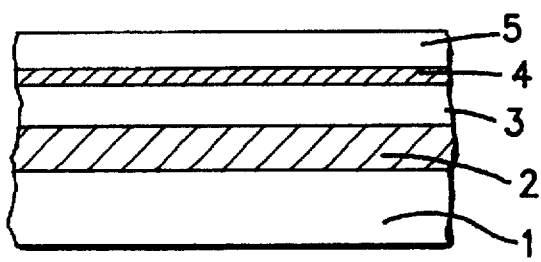
Figure 5E:
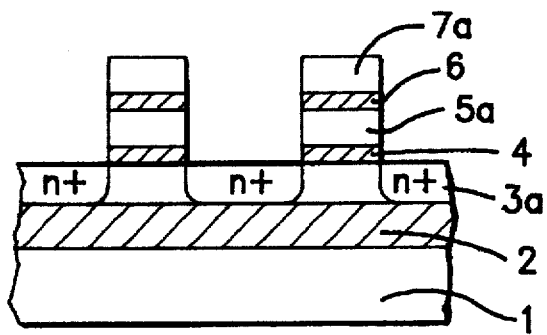
Figure 5C:
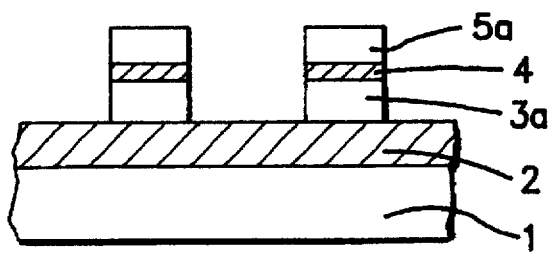

As shown in FIG. 5A, an SOI substrate formed on a silicon substrate 1 is used as a substrate. The SOI substrate is composed of a silicon oxide film 2 and a silicon thin film 3 formed thereon.

First, a gate oxide film 4 is formed on the entire surface of the SOI substrate. A polysilicon film 5 for the floating gate is formed on the gate oxide film 4 by means of CVD (Chemical Vapor Deposition) technique (see FIG. 5B).

Subsequently, the polysilicon film 5, the gate oxide film 4, and the silicon thin film 3 are sequentially subjected to selective etching processes by means of photolithographic and etching techniques. In this selective etching processes, the unnecessary portions of the films 3, the gate oxide film 4 and the polysilicon film 5 are removed. Next, a silicon oxide film 6 is formed on the exposed side walls of the silicon film 3a and the floating gate 5a. After formation of the film 6, a polysilicon film 7 is deposited on the entire surface of the resultant structure of the element (see FIG. 5D). Thereafter, the polysilicon film 7 is etched to form the control gate 7a. Thereafter, impurities for forming source and drain regions of the memory cells and other MOSFETs are ion-implanted vertically into the direction of the major surface of the SOI substrate. By this ion-implantation, diffusion layers are formed in the silicon film 3a (see FIG. 5E). Finally, processes such as an ordinary wiring formation process and the like are carried out to complete the nonvolatile semiconductor memory device.

An equivalent circuit of the memory cell obtained from the second embodiment is like that of the first embodiment. Also, in this embodiment, the control transistors T1 to T8 are formed of the side wall of the silicon film 3a and control gate 7a surrounding the memory cells. Therefore, it is similar to the foregoing embodiment shown in FIG. 3A to 3F in that the channel width of the control transistor in FIG. 4B is defined in both embodiments as the height of the side walls of the silicon film 3a.

In the second embodiment, the polysilicon thin film 5, the gate oxide film 4 and the silicon thin film 3 are etched with the same photo mask. Hence, a simplification of the manufacturing processes can be realized. As a result, manufacturing cost can be reduced and yield can be increased.

In the first and second embodiments of the present invention, the silicon film, the silicon oxide film, the silicon substrate and aluminum are used as the semiconductor film, the insulating film, the semiconductor substrate, and the wiring material, respectively. As a matter of course, other kinds of the semiconductor films, insulating films, semiconductor substrates, and conductive wiring materials may be used.

It should be understood that various alternatives to the embodiment of the invention described herein may be implied in practicing the invention. It is intended that the following claims define the scope of the invention and that structures within the scope of these claims and their equivalents be covered thereby.

What is claimed is:

1. An electrically programmable and erasable nonvolatile semiconductor memory device having a plurality of memory cells connected in series, each of said memory cells including a floating gate, a control gate, a source region, a drain region and a channel region and having a first threshold voltage in an erased condition and a second threshold voltage in a programmed condition, said nonvolatile semiconductor memory device comprising:

an insulating substrate:

a semiconductor film selectively formed on said insulating substrate and having therein the source region, the drain region and the channel region of each of said memory cells; and a plurality of MOSFETs, each sharing a different set of said channel, source and drain regions with an associated one of said memory cells so as to be connected in parallel to the associated one of said memory cells.

2. The nonvolatile semiconductor memory device as claimed in claim 1, wherein said floating gate is formed above said semiconductor film, and wherein said floating ate and said semiconductor film are surrounded with said control gate in a channel width direction of said memory cell.

3. The nonvolatile semiconductor memory device as claimed in claim 2, wherein each of said MOSFETs comprises one said control gate and a side wall region of one said channel region of said semiconductor film.

4. The nonvolatile semiconductor memory device as claimed in claim 1, the nonvolatile semiconductor memory device further comprising a select transistor at both ends of a memory array formed of said plurality of said memory cells wherein each said select transistor is formed in said semiconductor film.

5. The nonvolatile semiconductor memory device as claimed in claim 3, wherein a threshold voltage of each said MOSFET is designed to fall between said first and second threshold voltages of said memory cells.

6. A programmable and erasable nonvolatile semiconductor memory device comprising:

an insulating substrate;

a semiconductor film stripe on said substrate, said stripe comprising plural memory cell drain/source regions that are each separated from one another by a memory cell channel;

plural memory cells, each of said cells comprising one said memory cell channel and said drain/source regions on either side thereof, a floating gate on said memory cell channel, and a control gate on said floating gate; and plural control transistors, each associated with one of said memory cells, and each comprising one said memory cell channel and said drain/source regions on either side thereof and one said control gate, said one control gate further having side walls which are opposite side walls of said one memory cell channel;

whereby the memory device comprises a plurality of said memory cells connected in series and each of said memory cells is connected in parallel to its associated one of said control transistors, and whereby a channel width of each of said memory cells is defined by a width of said stripe and a channel width of each of said control transistors being defined by a height of said stripe.

7. The device of claim 6, further comprising oxide films for separating said control gate from said floating gate, said floating gate from said channel, and said control gate from said channel.

8. The device of claim 6, further comprising an oxide film for separating said insulating substrate from said stripe.

9. The device of claim 6, further comprising select transistors within said stripe at ends of said plural memory cells.

10. The device of claim 9, wherein said stripe is electrically connected to the device source and drain through said select transistors.

11. The device of claim 6, wherein said stripe has a width greater than its height.

12. The device of claim 6, wherein each of said memory cells has a first threshold voltage in an erased condition and a second threshold voltage in a programmed condition.

13. The device of claim 6, wherein each of said control transistors is a MOSFET with a threshold voltage between said first and second threshold voltages.

14. The device of claim 6, comprising plural ones of said stripe arrayed in parallel on said substrate.

15. The device of claim 14, wherein corresponding ones of said control gates of said memory cells in adjacent ones of said parallel stripes are merged to form a continuous control gate line generally perpendicular to said parallel stripes.

* * * * *